US010589988B2

(12) United States Patent
Heinzelmann et al.

(10) Patent No.: US 10,589,988 B2
(45) Date of Patent: Mar. 17, 2020

(54) MECHANICAL COMPONENT AND MANUFACTURING METHOD FOR A MECHANICAL COMPONENT

(71) Applicant: Robert Bosch GmbH, Stuttgart (DE)

(72) Inventors: Wolfgang Heinzelmann, Kirchentellinsfurt (DE); Mohamad Iyad Al Dibs, Pfullingen (DE); Rainer Straub, Ammerbuch (DE); Stefan Pinter, Reutlingen (DE); Frederic Njikam Njimonzie, Reutlingen (DE); Joerg Muchow, Reutlingen (DE); Helmut Grutzeck, Kusterdingen (DE); Simon Armbruster, Wannweil (DE); Sebastian Reiss, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 154 days.

(21) Appl. No.: 14/060,879

(22) Filed: Oct. 23, 2013

(65) Prior Publication Data
US 2014/0118005 A1    May 1, 2014

(30) Foreign Application Priority Data

Oct. 26, 2012  (DE) .................. 10 2012 219 660

(51) Int. Cl.
*G01R 29/26*   (2006.01)
*G01R 3/00*    (2006.01)
(Continued)

(52) U.S. Cl.
CPC .......... *B81B 7/008* (2013.01); *G02B 26/0858* (2013.01); *B81B 2203/0109* (2013.01);
(Continued)

(58) Field of Classification Search
CPC .............. G02B 26/0858; Y10T 29/49002
(Continued)

(56) References Cited

U.S. PATENT DOCUMENTS 5,484,073 A * 1/1996 Erickson ........................... 216/2
6,578,410 B1 * 6/2003 Israelachvili ......... B82Y 35/00
73/105
(Continued)

FOREIGN PATENT DOCUMENTS

CN    101131335 A    2/2008
CN    201047751 Y    4/2008
(Continued)

*Primary Examiner* — Jay Patidar
(74) *Attorney, Agent, or Firm* — Norton Rose Fulbright US LLP; Gerard Messina

(57) ABSTRACT

A mechanical component has: a mounting; a movable part which, with the aid of at least one first spring and one second spring, is connected to the mounting in such a way that the movable part is movable about a rotational axis extending through a first anchoring area of the first spring on the mounting and a second anchoring area of the second spring on the mounting; a first sensor device with at least one first resistor which is situated on and/or in the first spring; and a second sensor device with at least one second resistor situated on and/or in the second spring. The first sensor device includes a first Wheatstone half bridge and the second sensor device includes a second Wheatstone half bridge. The first and second Wheatstone half bridges are connected to form a Wheatstone full bridge.

11 Claims, 7 Drawing Sheets

(51) Int. Cl.
  *B81B 7/00* (2006.01)
  *G02B 26/08* (2006.01)

(52) U.S. Cl.
  CPC ... *B81B 2203/056* (2013.01); *B81B 2203/058* (2013.01); *Y10T 29/49002* (2015.01)

(58) Field of Classification Search
  USPC .......... 702/56; 337/107, 123, 139, 140, 365; 29/592.1; 324/613; 310/21, 10–12.33
  See application file for complete search history.

(56) References Cited

U.S. PATENT DOCUMENTS

| | | | |
|---|---|---|---|
| 6,612,029 B2* | 9/2003 | Behin et al. | 29/847 |
| 6,672,732 B1* | 1/2004 | Niendorf et al. | 359/877 |
| 7,446,911 B2* | 11/2008 | Asai | G02B 26/0833 358/474 |
| 7,750,767 B2 | 7/2010 | Jeong et al. | |
| 2008/0007376 A1 | 1/2008 | Jeong et al. | |
| 2008/0024590 A1* | 1/2008 | Nakajima | G02B 26/085 347/260 |
| 2010/0102403 A1* | 4/2010 | Celik-Butler et al. | 257/415 |
| 2011/0101821 A1* | 5/2011 | Pirk et al. | 310/300 |
| 2011/0248601 A1* | 10/2011 | Pirk et al. | 310/300 |
| 2011/0286069 A1* | 11/2011 | Pinter et al. | 359/224.1 |
| 2012/0125117 A1* | 5/2012 | Njikam Njimonzie et al. | 73/777 |

FOREIGN PATENT DOCUMENTS

| | | |
|---|---|---|
| CN | 102119118 A | 7/2011 |
| DE | 10 2009 026 501 A1 | 12/2010 |
| DE | 10 2010 029 074 | 11/2011 |
| GB | 2 475 081 A | 5/2011 |

\* cited by examiner

МЕCHANICAL COMPONENT AND MANUFACTURING METHOD FOR A MECHANICAL COMPONENT

BACKGROUND OF THE INVENTION

1. Field of the Invention

The present invention relates to a mechanical component and a manufacturing method for a mechanical component.

2. Description of the Related Art

FIG. 1 shows a schematic illustration of a conventional mechanical component.

The conventional mechanical component schematically depicted in FIG. 1 has a movable part 10 which is connected to a mounting 14 via a first spring 12a and a second spring 12b. At its end connected to mounting 14, first spring 12a has a connecting structure 16 as described in published German patent application document DE 10 2010 029 074 A1, for example. Second spring 12b is provided without a connecting structure 16 of this type.

Provided on connecting structure 16 is a Wheatstone full bridge 18, whose four resistors R1 through R4 are embedded on and/or in first spring 12a. Wheatstone full bridge 18 is grounded at a first contact 20, and is connected to a supply voltage at a second contact 22. In addition, voltage signals MVM1 and MVP1 may be tapped at a third contact 26 and at a fourth contact 28 of Wheatstone full bridge 18 and evaluated. With regard to the further mode of operation of Wheatstone full bridge 18, reference is made to published German patent application document DE 10 2010 029 074 A1.

BRIEF SUMMARY OF THE INVENTION

As described in greater detail below, the present invention provides a mechanical component having a sensor system composed of at least one first sensor device and one second sensor device, due to the advantageous circuitry of which an overall signal is generatable in which an output signal having (automatic) "minimization" of undesirable critical modes (spurious modes) is generatable/providable during operation of the mechanical component. In particular, frequencies which are associated with spurious modes in the frequency spectrum and which would interfere with the control system may be (automatically) "filtered out" in this way. The present invention thus allows utilization of a control system which has a comparatively simple design and which is therefore cost-effective.

The present invention thus allows a (piezoresistive) bridge connection, or a combination of at least two half bridges, which may (automatically) suppress or filter out frequencies associated with potential spurious modes. This automatic "filtering out" of unwanted signals requires no additional components such as filters. In addition, neither the adjustability of the movable part nor further functionality of the mechanical actuator is impaired by the filtering. Despite the automatic filtering, the sensor system, which is implementable from at least two sensor devices, has an advantageous sensitivity and a good offset.

The present invention is implementable with the aid of piezoresistive half bridges. The present invention may thus make use of the advantages of the piezoresistive detection compared to a capacitive or an inductive detection, such as comparatively interference-free signals and an advantageous linearity between a deflecting movement of the movable part and the signals thus generated.

In one advantageous specific embodiment, the first spring and/or the second spring extend(s) along the rotational axis. Likewise, the movable part may be centrally suspended between the first spring and the second spring. The mechanical component may thus have a comparatively simple geometry. However, instead of a design of the mechanical component having the torsion springs extending along the rotational axis, or a central suspension of the movable part, some other type of spring such as a meandering spring, or some other geometry for the mechanical component, may be selected.

The mechanical component advantageously includes an actuator device with the aid of which the movable part is excitable to undergo an oscillating motion about the rotational axis. The actuator device may include an electrostatic actuator, a magnetic actuator, and/or a piezoelectric actuator, for example. Use may thus be made of a variety of cost-effective actuator devices for the mechanical component. However, the design of the mechanical component is not limited to the actuators listed here.

In one advantageous refinement, the mechanical component includes a control device with the aid of which the actuator device is controllable into at least one operating mode in which the movable part is excitable to undergo a quasi-steady-state oscillating motion about the rotational axis. As described in greater detail below, the mechanical component is particularly advantageously designed to prevent/suppress resonant spurious modes which occur during a quasi-steady-state oscillating motion of the movable part.

The control device additionally may be designed to move the movable part during the quasi-steady-state oscillating motion at a first rotational speed in a first rotational direction about the rotational axis, and subsequently to move the movable part back at a second rotational speed which is greater than the first rotational speed, in a second rotational direction, opposite from the first rotational direction, about the rotational axis. An excitation of unwanted resonant spurious modes during the comparatively rapid readjustment of the movable part in the second rotational direction is easily preventable due to the advantageous design of the mechanical component. The mechanical component may thus be advantageously used for writing lines in a projector/image projector.

The above-mentioned advantages may also be ensured when the movable part is connected to the mounting in such a way that the movable part is transferable into at least two natural modes/natural oscillations. In addition, a plurality of natural modes/natural oscillations into which the movable part is transferable has little or no ability to impair a desired quasi-steady-state operation of the movable part. The signal of at least one spurious mode is suppressable due to the advantageous circuitry (implementation) of the Wheatstone half bridges. The situation may thus be prevented in which the signal of the at least one spurious mode/interference frequency occurs in a control loop and adversely influences same. Thus, even a control system having a simple design may be used for controlling the mechanical component.

The mechanical component may be a micromechanical component. In particular, at least subunits of the mechanical component may be structured out of a semiconductor substrate. Use may thus be made of the above-mentioned advantages for a plurality of micromechanical components.

In another advantageous specific embodiment, at least one continuous recess which divides the first spring and/or second spring in each case into at least two partial spring strands is formed in the first spring and/or in the second spring. In particular, two continuous recesses may divide the first spring and/or the second spring into three parallel partial strands. A spring suspension on a mechanical component may thus be implemented which ensures that comparatively high mechanical stresses occur in the resistors of the Wheatstone half bridges during an adjustment motion of the movable part.

In another advantageous refinement, the movable part is connected via at least one intermediate spring to a drive member which is suspended between the first spring and the second spring. The mechanical component may thus also be designed as a double oscillating system in which the drive member is transferable into an oscillating motion with respect to the mounting, and the movable part is transferable into a further oscillating motion with respect to the drive member.

The above-mentioned advantages are also ensured for a corresponding manufacturing method for a mechanical component.

DETAILED DESCRIPTION OF THE INVENTION

FIGS. 2a through 2i show schematic illustrations and coordinate systems for explaining a first specific embodiment of the mechanical component.

Figure 1:
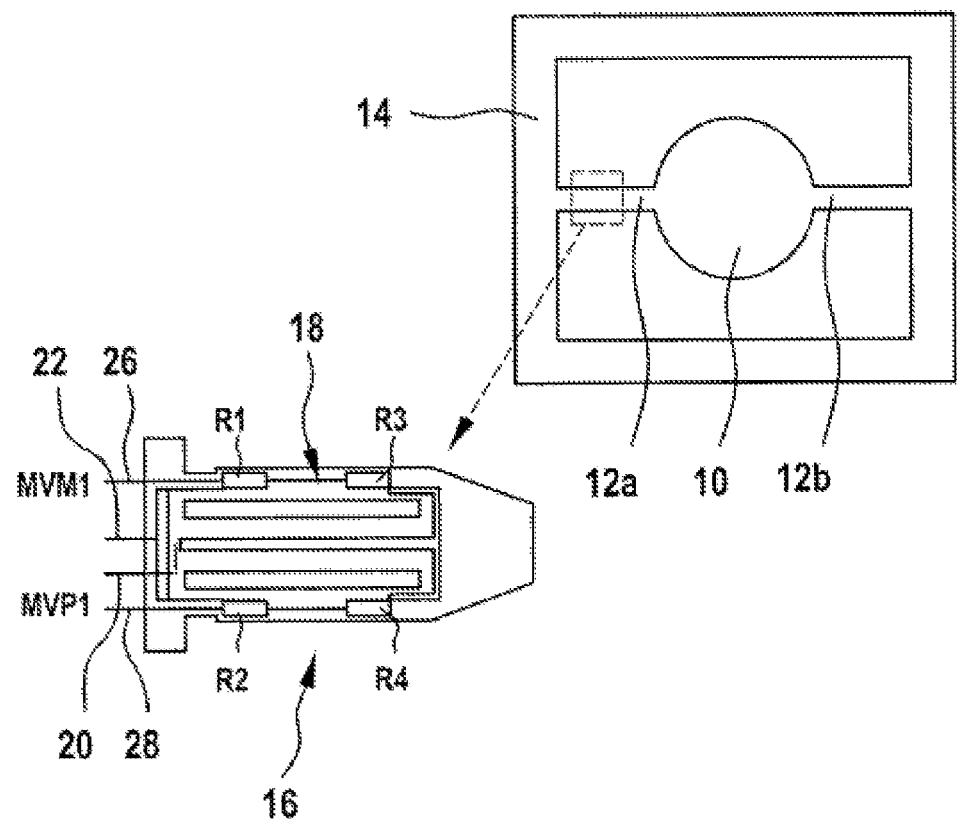
FIG. 1 shows a schematic illustration of a conventional mechanical component.
Figure 2A:
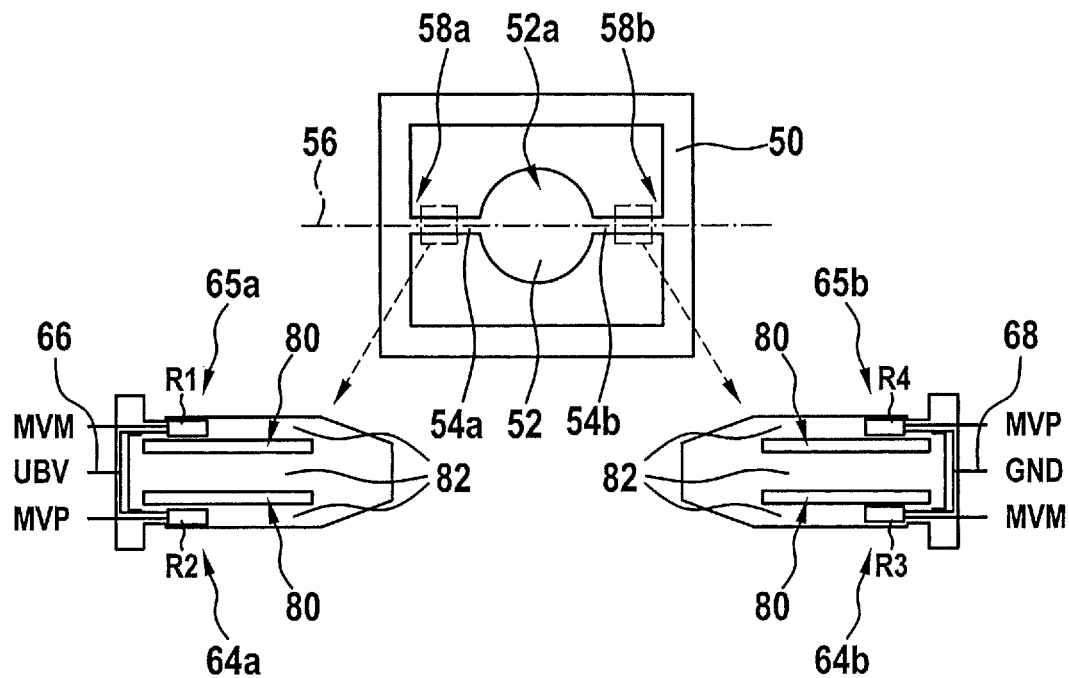
FIGS. 2a through 2i show schematic illustrations and coordinate systems for explaining a first specific embodiment of the mechanical component.
Figure 2B:
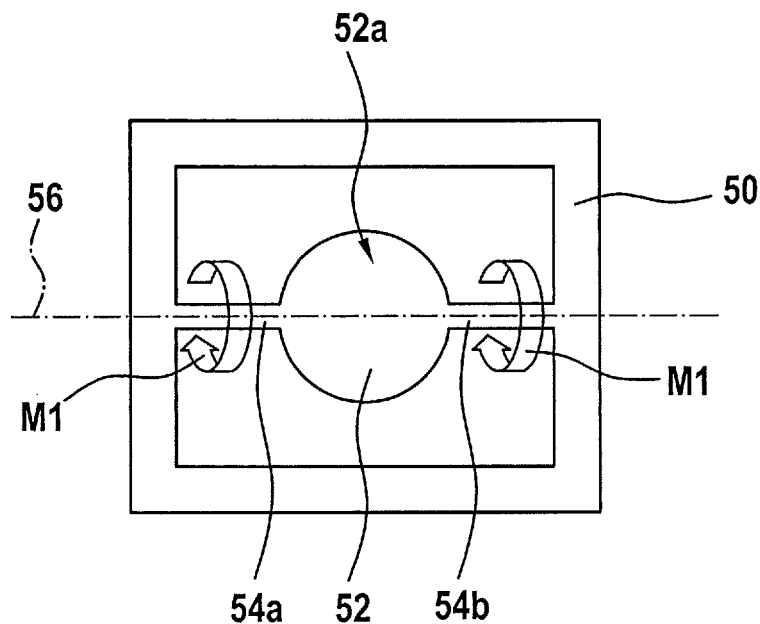
Figure 2C:
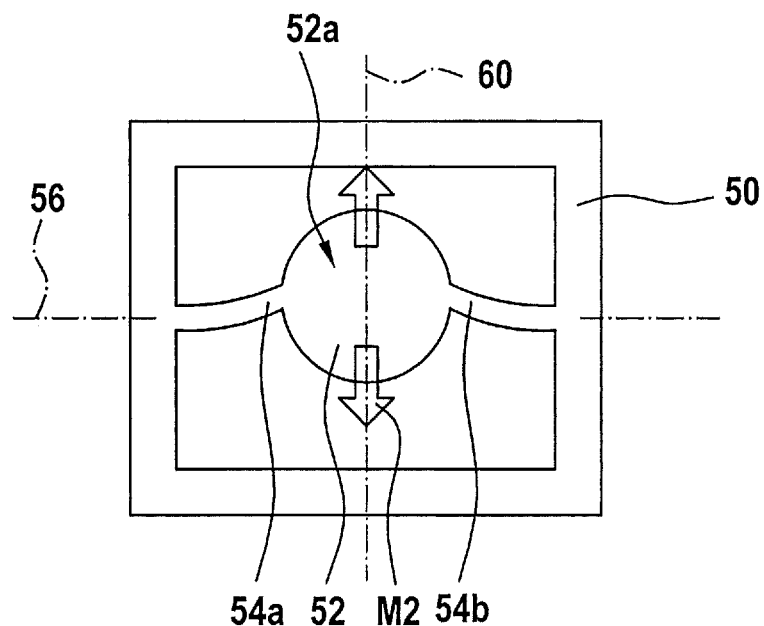
Figure 2D:
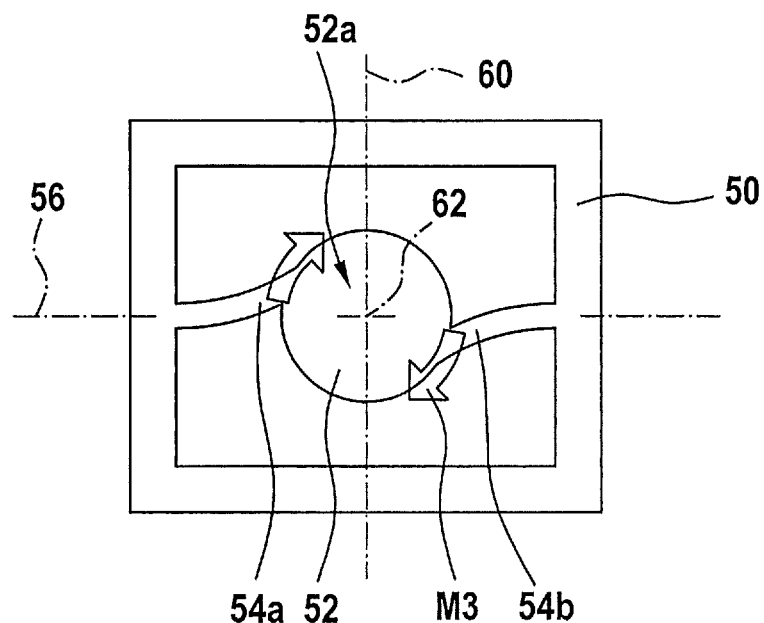

The mechanical component schematically illustrated in FIG. 2a has a mounting 50 and a movable part 52, movable part 52 being connected to mounting 50 via at least one first spring 54a and one second spring 54b. Springs 54a and 54b, which are also illustrated in part in enlarged scale in FIG. 2a, connect movable part 52 to mounting 50 in such a way that movable part 52 is movable with respect to mounting 50 at least about a rotational axis 56. Rotational axis 56 extends through a first anchoring area 58a of first spring 54a at mounting 50 and a second anchoring area 58b of second spring 54b at mounting 50. These anchoring areas 58a and 58b are illustrated in enlarged scale in FIG. 2a.

In the specific embodiment in FIGS. 2a through 2i, movable part 52 has at least one optically active surface 52a such as a reflective surface. However, the design of the mechanical component is not limited to this type of movable part 52.

In particular, first spring 54a and/or second spring 54b may each be a torsion spring which extends along rotational axis 56. However, the design of the mechanical component is not limited to a specific type of spring for springs 54a and 54b. Springs 54a and 54b may also have a meandering design, for example. Movable part 52 may be centrally suspended between first spring 54a and second spring 54b. Instead of a central suspension, however, a noncentral suspension of movable part 52 is also possible.

The mechanical component may be a micromechanical component. In particular, components 50, 52, 54a, and 54b may be structured all together from a semiconductor substrate or from an SOI substrate. The mechanical component may thus be manufactured easily and cost-effectively in an advantageously small size.

Movable part 52 may be connected to mounting 50 in such a way that movable part 52 is transferable into at least two natural modes/natural oscillations with respect to mounting 50. As explained in greater detail below, even slight excitability of movable part 52 into the at least two natural modes is not able or is hardly able to counteract/disturb a desired nonresonant operation of the mechanical component.

In the specific embodiment in FIGS. 2a through 2i, movable part 52 is excitable to undergo four different natural modes/natural oscillations M1 through M4 with respect to mounting 50. Natural modes M1 through M4 are depicted in FIGS. 2b through 2e. In natural mode M1 illustrated in FIG. 2b, movable part 52 oscillates resonantly about rotational axis 56. In natural mode M1, movable part 52 thus undergoes a rotary movement with respect to mounting 50.

In contrast, in natural mode M2, movable part 52 oscillates along an axis 60 which is oriented in parallel to a neutral position of optically active surface 52a of movable part 52. Axis 60 may intersect rotational axis 56, in particular perpendicularly. In addition, axis 60 may extend centrally through mounting 50 and/or movable part 52. Natural mode M2 is a translatory movement which extends in-plane. Springs 54a and 54b are symmetrically bent in natural mode M2.

Natural mode M3 occurs due to asymmetrical bending of springs 54a and 54b, thus rotating movable part 52 about a perpendicular bisector 62 oriented perpendicularly with respect to the neutral position of optically active surface 52a of movable part 52. Perpendicular bisector 62 may in particular be oriented perpendicularly with respect to axes 56 and 60. Natural mode M3 is a rotatory in-plane movement.

Figure 2E:
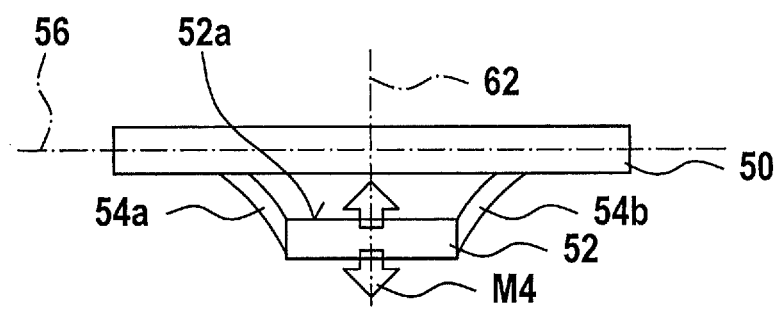

Natural mode M4 schematically depicted in FIG. 2e occurs with symmetrical bending of springs 54a and 54b, in which movable part 52 is moved along perpendicular bisector 62. Natural mode M4 may also be described as a translatory out-of-plane movement.

For operation of a mechanical component having a movable part 52, at least one sensor device 64a and 64b is generally used to ascertain, optionally to intensify or suppress, a wanted and/or unwanted movement of movable part 52. Thus, the mechanical component schematically illustrated in FIG. 2a has a first sensor device 64a which has at least one first resistor R1 and R2 situated on and/or in first spring 54a. A second sensor device 64b with at least one second resistor R3 and R4 situated on and/or in second spring 54b may additionally be utilized in the mechanical component. First sensor device 64a includes a first Wheatstone half bridge 65a. A second Wheatstone half bridge 65b is an integral part of second sensor device 64b. First Wheatstone half bridge 65a and second Wheatstone half bridge 65b are connected to form a Wheatstone full bridge.

Figure 2F:
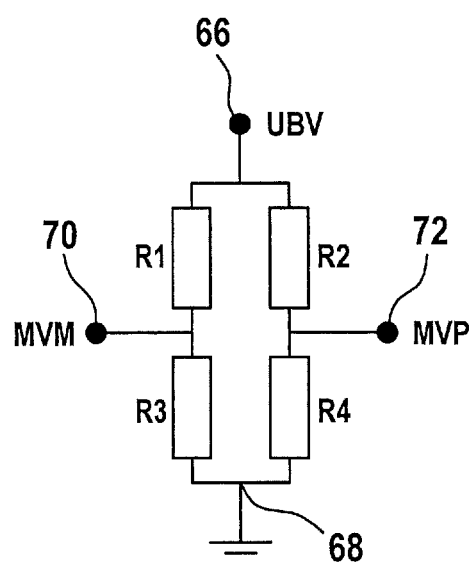

FIG. 2f illustrates the circuit diagram of connected sensor devices 64a and 64b. A contact 66 to which a supply voltage UBV is applied is situated between resistors R1 and R2 of first Wheatstone half bridge 65a. A contact 68 between resistors R3 and R4 of second Wheatstone half bridge 65b is grounded. A signal MVM may be tapped as a bridge output voltage at a contact 70 between resistor R1 of first Wheatstone half bridge 65a and resistor R3 of second Wheatstone half bridge 65b. A further signal MVP is tappable as the bridge output voltage at a contact 72 between resistor R2 of first Wheatstone half bridge 65a and resistor R4 of second Wheatstone half bridge 65b. It is pointed out that an adder and/or differentiator is not needed for providing/evaluating signals MVM and MVP, as is the case according to the related art.

The mechanical component also preferably includes an actuator device (not illustrated) with the aid of which movable part 52 is excitable to undergo an oscillating motion about rotational axis 56. The actuator device may include an electrostatic actuator, a magnetic actuator, and/or a piezoelectric actuator, for example. However, the design of the mechanical component is not limited to a specific type of actuator.

In addition, the mechanical component may include a control device with the aid of which the actuator device is controllable. In the specific embodiment in FIGS. 2a through 2i, the actuator device is controllable with the aid of a control device (not illustrated) into at least one operating mode in which movable part 52 is excitable to undergo a quasi-steady-state oscillating motion about rotational axis 56. A quasi-steady-state oscillating motion may be understood to mean a nonresonant oscillating motion of movable part 52. For the quasi-steady-state oscillating motion, movable part 52 is driven at frequencies f below 100 Hz, for example. In the specific embodiment in FIGS. 2a through 2i as an example, the drive occurs by energizing a coil (not illustrated) mounted on movable part 52, via which a magnetic field is inducible which may interact with an external magnetic field of a permanent magnet (not illustrated).

Figure 2G:
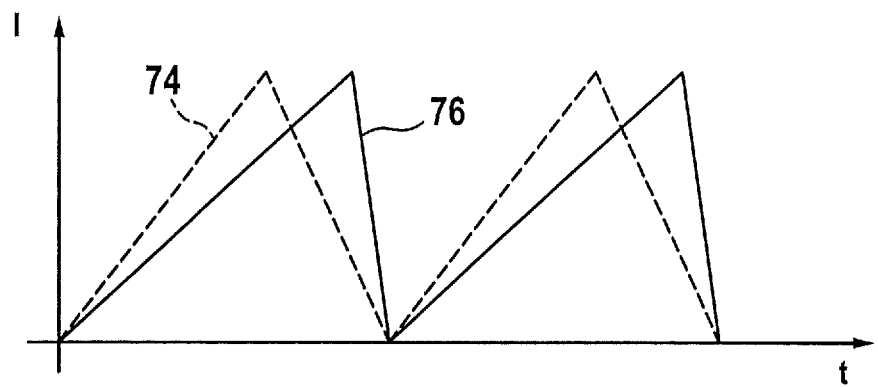

FIG. 2g shows a coordinate system in which the abscissa is time axis t, while the ordinate is a current intensity I of a current conducted through the coil. Graph 74 depicts a current curve in which movable part 52 is moved at the same rotational speed about rotational axis 56 in both rotational directions. However, a current curve which may be described as sawtooth-shaped, depicted in graph 76, is preferred. For this purpose, the control device is designed to move movable part 52 at a first rotational speed in a first rotational direction about rotational axis 56 during the quasi-steady-state oscillating motion, and subsequently to move the movable part back at a second rotational speed which is greater than the first rotational speed, in a second rotational direction opposite from the first rotational direction, about rotational axis 56. In this case, optically active surface 52a of movable part 52 may be used particularly well to write a line of a projected image with the aid of a light beam, for example a laser beam, directed thereon. The mechanical component is thus usable in a particularly advantageous manner in a laser image projector.

Figure 2H:
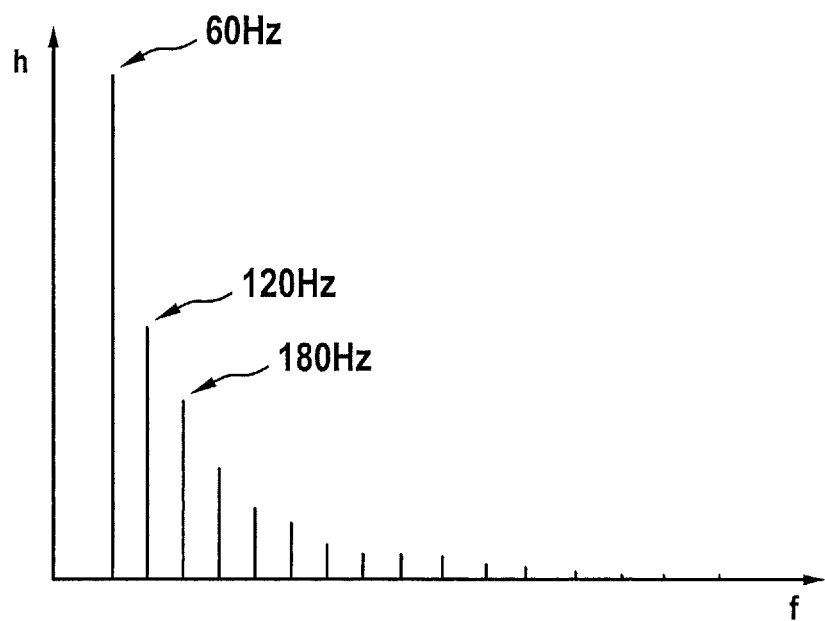

The rapid movement of the movable part back in the second rotational direction simplifies the line-by-line projection of an image. However, high-frequency components in the same frequency ranges may also be excited, in particular during the comparatively rapid back-movement. The coordinate system in FIG. 2h shows a frequency of occurrence h of high-frequency components in the excitation signal. It is apparent that frequencies that are multiples of the 60-Hz excitation frequency may also be excited comparatively often. This may also result in particular in unwanted excitation of natural modes M1 through M4 when these meet at a multiple of the 60-Hz setpoint frequency due to manufacturing variations.

However, the mechanical component is easily and reliably controllable with the aid of the bridge output voltage, which is detected as a measured variable, when the undesirable natural modes M1 through M4 are prevented. Natural modes M1 through M4 are thus not able to disturb the desired quasi-steady-state oscillating motion of movable part 52, for example at 60 Hz.

Figure 2I:
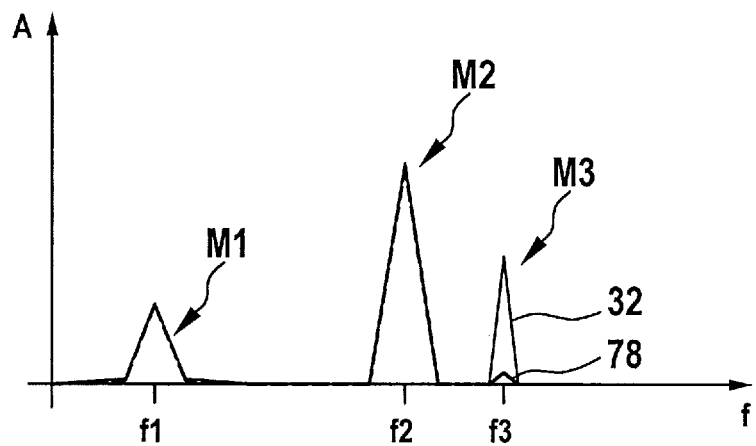

FIG. 2i shows a coordinate system in which the abscissa denotes frequencies f, while the ordinate corresponds to an amplitude A of occurring natural modes M1 through M3. Graph 78 indicates the amplitudes of natural modes M1 through M3 of the specific embodiment in FIGS. 2a through 2i. Graph 32 of a conventional full bridge provided on a spring of a conventional component is plotted in the coordinate system of FIG. 2i for comparison.

A comparison of graphs 32 and 78 shows that natural mode M3 is greatly suppressed in signals MVM and MVP, which are evaluated as the bridge output voltage of connected Wheatstone half bridges 65a and 65b. Due to the advantageous connection of the two Wheatstone half bridges 65a and 65b, use is made of the advantage that natural mode M3 causes mechanical stresses in resistors R1 through R4 which have the same magnitude but opposite algebraic signs. This may also be referred to as automatic filtering of natural mode M3. Thus, despite a comparatively small distance between natural frequencies f2 and f3, there is a clear distinction between associated natural modes M2 and M3. This significantly simplifies the desired suppression of at least one spurious mode during a quasi-steady-state operation of the mechanical component.

It is pointed out that use of at least one linear controller is possible in FIGS. 2a through 2i. Thus, a comparatively low level of effort for development, implementation, and/or computation is sufficient for an ASIC used as an evaluation device.

As a refinement, the specific embodiment in FIGS. 2a through 2i has at least one continuous recess 80 in first spring 54a and/or in second spring 54b which in each case divides first spring 54a and/or second spring 54b into at least two partial spring strands. In particular, the mechanical component in each of springs 54a and 54b has two continuous recesses 80, close to anchoring areas 58a and 58b, which extend in particular in parallel to one another. The two continuous recesses 80 divide the particular spring section into three parallel partial strands 82. Resistors R1 through R4 preferably rest on partial strands 82. It is thus reliably ensurable that an adjustment motion of movable part 52 causes a mechanical stress/a mechanical tension in resistors R1 through R4.

Figure 3:
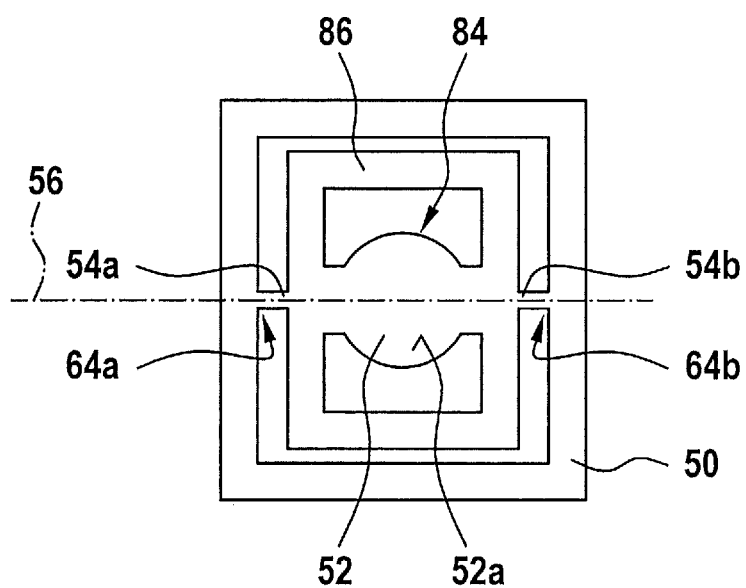
FIG. 3 shows a schematic illustration of a second specific embodiment of the mechanical component.

FIG. 3 shows a schematic illustration of a second specific embodiment of the mechanical component.

The mechanical component schematically depicted in FIG. 3 has the above-described components. However, they are not illustrated in greater detail in FIG. 3 for the sake of better clarity.

The mechanical component in FIG. 3 is a refinement in which movable part 52 is connected via at least one intermediate spring 84 to a drive member 86 which is suspended between a first spring and a second spring. For example, a coil which is usable for inducing a magnetic field may be situated on drive member 86. The at least one intermediate spring 84 may in particular contact movable part 52 on a side facing away from optically active surface 52a, so that a sufficient spring length of the at least one intermediate spring 84 is ensurable despite a comparatively large design of movable part 52 and a relatively small size of drive member 86.

Also in the mechanical component in FIG. 3, wanted as well as unwanted movements of oscillating body 52 may be detected by the two Wheatstone half bridges 65a and 65b with the aid of piezoresistive detection. The natural modes/ spurious modes may be minimized or eliminated by suitable control. Use may thus be made of the suppression of at least one natural mode due to the advantageous connection of the two Wheatstone half bridges 65a and 65b.

Figure 4:
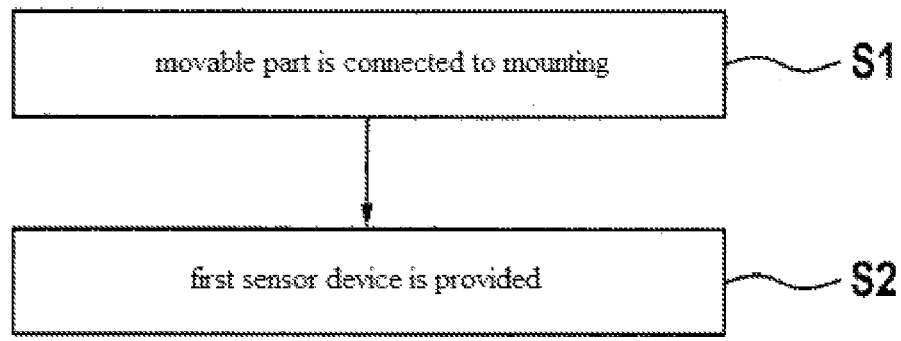
FIG. 4 shows a flow chart for explaining one specific embodiment of the manufacturing method.

FIG. 4 shows a flow chart for explaining one specific embodiment of the manufacturing method.

The above-described mechanical components, for example, may be manufactured with the aid of the manufacturing method described below. However, the practicability of the manufacturing method is not limited to the manufacture of mechanical components of this type.

A movable part is connected to a mounting with the aid of at least one first spring and one second spring in a method step S1 in such a way that during operation of the mechanical component, the movable part is moved with respect to the mounting at least about a rotational axis which extends through a first anchoring area of the first spring on the mounting and a second anchoring area of the second spring on the mounting. The movable part may be structured out of a semiconductor substrate together with the first spring, the second spring, and/or the mounting, for example, in method step S1.

A first sensor device with at least one first resistor situated on and/or in the first spring and a second sensor device with at least one second resistor situated on and/or in the second spring are provided in a method step S2. The first sensor device is provided with a first Wheatstone half bridge. Similarly, the second sensor device is also equipped with a second Wheatstone half bridge. In addition, the first Wheatstone half bridge and the second Wheatstone half bridge are connected together to form a Wheatstone full bridge.

Thus, with the aid of the method described herein, mechanical components may be manufactured which achieve the above-described advantages. The numbering of method steps S1 and S2 does not specify a time sequence for carrying out the steps.

What is claimed is:

1. A mechanical component, comprising:
   a mounting;
   a movable part connected via at least one first spring and one second spring to the mounting so that the movable part is movable with respect to the mounting at least about a rotational axis extending through a first anchoring area of the first spring on the mounting and a second anchoring area of the second spring on the mounting;
   a first sensor device with at least one first resistor situated at least one of on or in the first spring; and
   a second sensor device with at least one second resistor situated at least one of on or in the second spring;
   wherein the first sensor device includes a first Wheatstone half bridge and the second sensor device includes a second Wheatstone half bridge, the first Wheatstone half bridge and the second Wheatstone half bridge being connected to form a Wheatstone full bridge,
   wherein the mechanical component includes an actuator device with the aid of which the movable part is excitable to undergo an oscillating motion about the rotational axis,
   wherein the mechanical component includes a control device with the aid of which the actuator device is controlled into at least one operating mode in which the movable part is excitable to undergo a quasi-steady-state oscillating motion about the rotational axis,
   wherein the first and second Wheatstone bridges are connected to each other such that at least one signal generated by a rotatory in-plane movement of the movable part is suppressed.

2. The mechanical component as recited in claim 1, wherein at least one of:
   the first spring extends along the rotational axis;
   the second spring extends along the rotational axis; and
   the movable part is centrally suspended between the first spring and the second spring.

3. The mechanical component as recited in claim 2, wherein the movable part is connected via at least one intermediate spring to a drive member which is suspended between the first spring and the second spring.

4. The mechanical component as recited in claim 1, wherein the control device is configured to (i) move the movable part during the quasi-steady-state oscillating motion at a first rotational speed in a first rotational direction about the rotational axis, and (ii) subsequently move the movable part back at a second rotational speed which is greater than the first rotational speed, in a second rotational direction, opposite from the first rotational direction, about the rotational axis.

5. The mechanical component as recited in claim 1, wherein the movable part is connected to the mounting so that the movable part is transferable into at least two natural modes.

6. The mechanical component as recited in claim 5, wherein the at least two natural modes do not impair a desired quasi-steady-state oscillating motion of the movable part.

7. The mechanical component as recited in claim 1, wherein the mechanical component is a micromechanical component.

8. The mechanical component as recited in claim 1, wherein at least one continuous recess is provided in at least one of the first spring and the second spring, and wherein the at least one continuous recess divides at least one of the first spring and the second spring in each case into at least two partial spring strands.

9. The mechanical component as recited in claim 8, wherein two continuous recesses are provided in at least one of the first spring and the second spring, and wherein the two continuous recesses divide at least one of the first spring and the second spring in each case into three parallel partial strands.

10. The mechanical component as recited in claim 1, wherein the at least one first spring and the at least one second spring are torsion springs.

11. A manufacturing method for a mechanical component, having the following steps:
   connecting a movable part to a mounting via at least one first spring and one second spring so that during operation of the mechanical component the movable part is moved with respect to the mounting at least about a rotational axis extending through a first anchoring area of the first spring on the mounting and a second anchoring area of the second spring on the mounting;
   providing a first sensor device with at least one first resistor situated at least one of on or in the first spring;
   providing a second sensor device with at least one second resistor situated at least one of on or in the second spring;
   providing the first sensor device with a first Wheatstone half bridge;
   providing the second sensor device with a second Wheatstone half bridge; and
   connecting the first Wheatstone half bridge and the second Wheatstone half bridge to form a Wheatstone full bridge, wherein the mechanical component includes an actuator device with the aid of which the movable part is excitable to undergo an oscillating motion about the rotational axis, wherein the mechanical component includes a control device with the aid of which the actuator device is controlled into at least one operating mode in which the movable part is excitable to undergo a quasi-steady-state oscillating motion about the rotational axis, wherein the first and second Wheatstone bridges are connected to each other such that at least one signal generated by a rotatory in-plane movement of the movable part is suppressed.

* * * * *